(12) United States Patent
Anderl et al.

(10) Patent No.: US 9,695,829 B2
(45) Date of Patent: Jul. 4, 2017

(54) VARIABLE INLET VANES

(71) Applicant: International Business Machines Corporation, Armonk, NY (US)

(72) Inventors: William J. Anderl, Rochester, MN (US); Karl Stathakis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/091,152

(22) Filed: Apr. 5, 2016

(65) Prior Publication Data

US 2016/0215779 A1    Jul. 28, 2016

Related U.S. Application Data

(63) Continuation of application No. 14/749,236, filed on Jun. 24, 2015, which is a continuation of application No. 14/606,266, filed on Jan. 27, 2015.

(51) Int. Cl.
| | |
|---|---|
| *F04D 19/02* | (2006.01) |
| *F04D 25/16* | (2006.01) |
| *F04D 19/00* | (2006.01) |
| *F04D 29/56* | (2006.01) |
| *F04D 29/64* | (2006.01) |
| *B23P 19/00* | (2006.01) |
| *H05K 7/20* | (2006.01) |
| *F04D 29/60* | (2006.01) |

(52) U.S. Cl.
CPC ............ *F04D 19/024* (2013.01); *B23P 19/00* (2013.01); *F04D 19/007* (2013.01); *F04D 25/166* (2013.01); *F04D 29/563* (2013.01); *F04D 29/601* (2013.01); *F04D 29/646* (2013.01); *H05K 7/20145* (2013.01); *H05K 7/20172* (2013.01)

(58) Field of Classification Search
None
See application file for complete search history.

(56) References Cited

U.S. PATENT DOCUMENTS

| | | | | |
|---|---|---|---|---|
| 2,976,352 | A * | 3/1961 | Atalla | F04D 17/162 415/119 |
| 7,946,336 | B2 * | 5/2011 | Wang | H01L 23/467 165/80.2 |
| 8,408,981 | B2 * | 4/2013 | Su | F04D 29/441 165/104.34 |

(Continued)

*Primary Examiner* — Jessica Cahill
*Assistant Examiner* — Daphne M Barry
(74) *Attorney, Agent, or Firm* — Nathan M. Rau

(57) ABSTRACT

A cooling system that includes two or more fans that each have a chassis. The chassis includes a first face, a second face, and a sidewall. The fans then can be attached to each other by attaching a sidewall of a first fan chassis to a sidewall of a second fan chassis. An adjustable vane is attached perpendicularly and approximately equidistant between the fans, with an angular control element that is attached to the first fan chassis. The vane can be oriented such that the vane divides the airflow distributed to the fans. The vane then can be adjusted radially by the angular control element, which is attached to the fan chassis. If an impeller of a fan chassis fails the vane can be adjusted radially using an angular control element to distribute more airflow to the failed fan superimposing the non-failed fan chassis.

1 Claim, 8 Drawing Sheets

(56) References Cited

U.S. PATENT DOCUMENTS

| | | | |
|---|---|---|---|
| 8,467,906 B2 | 6/2013 | Michael et al. | |
| 8,547,694 B2 | 10/2013 | Tang | |
| 8,840,453 B2* | 9/2014 | Izuno | H05K 7/20727 |
| | | | 361/679.46 |
| 9,433,124 B2* | 8/2016 | Wilcox | H05K 7/20145 |
| 9,433,131 B2* | 8/2016 | Joko | H05K 7/20145 |
| 2007/0081888 A1* | 4/2007 | Harrison | F04D 19/007 |
| | | | 415/47 |
| 2011/0175007 A1 | 7/2011 | Sato et al. | |
| 2013/0210334 A1* | 8/2013 | Tan | H05K 7/20727 |
| | | | 454/184 |
| 2016/0215783 A1* | 7/2016 | Anderl | F04D 19/024 |
| 2016/0219754 A1* | 7/2016 | Anderl | F04D 19/024 |

* cited by examiner

VARIABLE INLET VANES

BACKGROUND

The present disclosure relates to condition responsive heat exchange with cooling capacity, and more specifically, controlling and directing airflow using a fan that has cooling capacity.

Counter-rotating fans are used to cool computational electronic components, which can be include singular fan housings with multiple fan blades attached to multiple motors, configured such that placing two singular fans in line with each other such that the airflow exhaust becomes the intake of the next fan rotating opposite of the first fan, increasing the exhaust of the fan system. Typically counter-rotating fans are used to cool large systems which can require varying amounts of airflow depending on the amount of heat produced by the system.

SUMMARY

Certain embodiments of the present disclosure are directed toward a method of cooling electrical components by directing airflow and reducing airflow and pressure differentials after a fan failure or malfunction.

One embodiment is directed towards a cooling system that includes two or more fans that each have a chassis. The chassis includes a first face, a second face, and a sidewall, and the fans are attached to each other with one sidewall of the fan to a sidewall of another fan. The fans can then be attached to a frame of a computer system which holds the fans in place and orients the airflow of the fans to cool the computer system. An adjustable vane, attached perpendicularly to the frame between the fans, can be connected to an angular control element mounted on the chassis. The vane is oriented such that the vane divides the airflow distributed to the fans. The vane then can be adjusted radially on the angular control element on the chassis of the fans. The radial adjustment of the vane can occur when a fan fails, causing the angular control element to distribute more airflow to the failed fan.

One embodiment of a cooling system is directed towards constructed by positioning two or more fan chassis with a sidewall of each of the fan chassis being approximately parallel. A sidewall of a first fan chassis is attached to a sidewall of a second fan chassis. A vane is then aligned perpendicularly to a first face of the first fan chassis and a first face of the second fan chassis, and attached to the first fan chassis with angular control elements. The angular control elements are attached such that they are able to radially adjust the position of the vane relative to the first faces of the first and second fan chassis based on an airflow entering the cooling system.

One embodiment is directed towards controlling a vane to distribute airflow to a cooling system. According to various embodiments an angular control element can be a motor configured to radially adjust a position of a vane. The angular control element can be coupled electrically with a control unit. The control unit can receive measurements from a monitoring unit. The control unit receives the measurements from each of the adjacent fan chassis, and can calculate a difference between each of the measurements. The angular control element can receive data from the control unit to adjust the vane based on the difference between the measurements received by the monitoring unit. The vane can be adjusted toward the fan chassis towards a closed position to superimpose the intake of the fan chassis.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
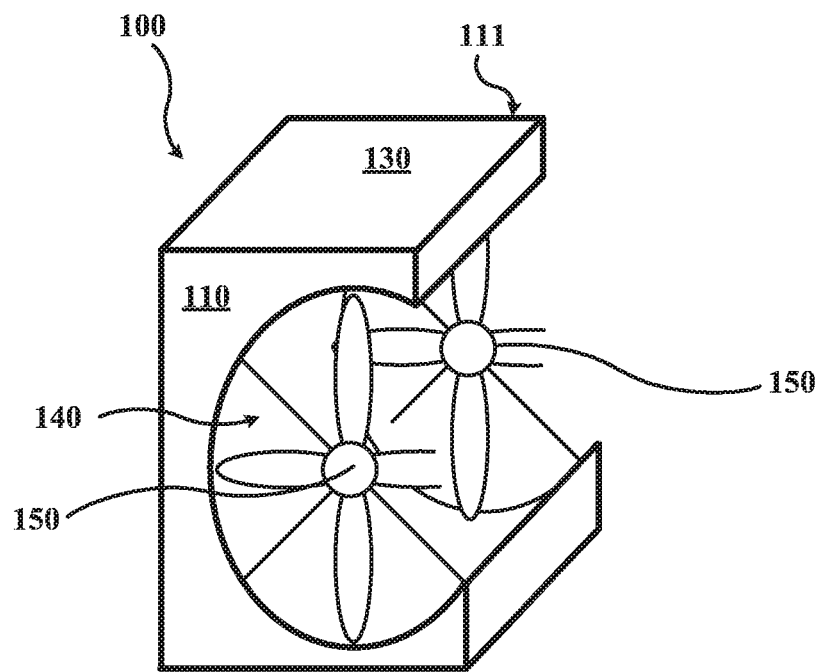
FIG. 1A illustrates a cut away view of a multiple impeller counter-rotating fan system with three impellers, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to vanes configured to control the airflow entering into to working fans which causes the exhaust of the working fan and the failed fan to be similar, reducing the uneven airflow distribution to the system. More particular aspects relate to using radially adjustable vanes to direct the incoming airflow into the fans adjacent to the vane. While the present disclosure is not necessarily limited to such applications, various aspects of the disclosure may be appreciated through a discussion of various examples using this context.

Methods for directing airflow to a system can be focused on resolving the problem of fans malfunctioning or failing in a cooling system. When fans in a computer system fail, the airflow within the system can be effected, leading to heat build-up, which can damage the computer system. Counter-rotating multiple impeller fans contain two or more impellers aligned in series, wherein an exhaust of the first impeller increases speed at which a second impeller will rotate, by feeding the exhaust of the first impeller into the intake of the second impeller in turn increasing the speed at which the airflow exhausts the second impeller. These counter-rotating multiple impeller fans can be used in Central Electronic Complex (CEC) systems to move large volumes of airflow for cooling purposes.

When an impeller of a counter-rotating fans of a multiple impeller fan fails, the surrounding sets of non-failed fans can exhaust two to three times more airflow, compared to the fan with the failed impeller(s). When the airflow is pulled away from the entrance of the failed fan into the non-failed fans, a negative pressure can result within the computer system, causing the cool air to be distributed unevenly. Uneven airflow distribution among the exhaust fans of a cooling system can lead to reduced cooling capacity of the system, by the fans. The reduced cooling capacity of the system can lead to the heat build-up, and component failure.

Cooling fans can fail in various ways. Examples of fan failure can include, a foreign object entering the fan system causing stoppage or damage to one or more of the impellers or impeller blades, or a motor failure causing the fan to no longer rotate or causing the fan to rotate freely but not increasing the airflow. Each of these representative failures can cause the fan chassis containing one or more failed impellers to produce a lesser airflow compared to fully functioning fan chassis, without a failed impeller. The airflow differential can cause uneven airflow distribution leading to heat build-up within the system.

Cooling fans are an integral part of cooling a central electronic complex (CEC) system which is a set of hardware that defines a mainframe. The CEC system can include but is not limited to, computer processing units (CPUs), memory, channels, controllers, and power supply. Fans are necessary for the cooling of these electronics for the dispersion of the heat generated during computation processes.

Counter-rotational fans can be manufactured out of two single impeller fan chassis or purchased as a single chassis unit with two impellers. In embodiments Counter-rotational fans include at least two impellers. In embodiments with two impellers, contain blades of a first impeller rotating a first direction with blades orientated in a first direction and a second impeller rotating a second direction with blades orientated in a second direction. An example embodiment of a single chassis multiple impeller unit has, a first impeller with a first direction of rotation which can be clockwise and will have the blades orientated in the first direction where the blades pull airflow into the fan blades. The second impeller will rotate opposite of the first impeller where the impeller can rotate in the second direction of rotation or counter-clockwise, with the blades ordinated in the second direction, where the blades rotating counter-clockwise will pull the exhaust airflow from the first impeller and exhaust the airflow out the fan chassis. A counter-rotational fan with the capacity to cool CEC systems can be purchased for example, from Delta Products Corporation®.

After an impeller failure, the airflow in the system can be affected with a conical area of lower or higher air pressure at the entrance of the fans. This localized pressure differential at the fan locations can cause more airflow to enter the working fans and less airflow to enter the failed fan causing a lower intake of airflow. The conical area of lower or higher air pressure enlarges as the adjacent fans pull the airflow away from the failed fan. Also since the localized pressure differential causes the fans to intake less airflow, the fans can exhaust a decreased amount of airflow causing an uneven exhaust exiting the fan chassis. The uneven exhaust of the fan chassis can decrease the cooling efficiency of the fan system.

FIG. 1A illustrates one embodiment of a multiple impeller counter-rotating fan chassis 100. The multiple impeller counter-rotating fan can include, a chassis 100, with a first face 110 with an opening 140 for the multiple impellers 150, and at least one sidewall 130. According to embodiments, the chassis 100 includes at least a first face 110 with an opening 140, which intakes airflow, a second face with an opening 111, which exhausts the airflow. Inside the first face opening 140 multiple impellers 150 can be positioned to pull airflow into the multiple impeller fan chassis 100. An impeller can be a fan (an air-moving component) that can include: a motor with a center of rotation, one or more blades, and a blade support that connects the motor to the one or more blades. In embodiments, the impellers can pull or push air into or out of a system for cooling purposes. The multiple impellers 150 pull airflow through the opening 140 of the first face 110, accelerates the air, and exhaust the airflow through the opening of the second face 111 into the computing device. Examples of computing devices can include, but are not limited to, a data processing unit, a server, or a personal computer.

Figure 1B:
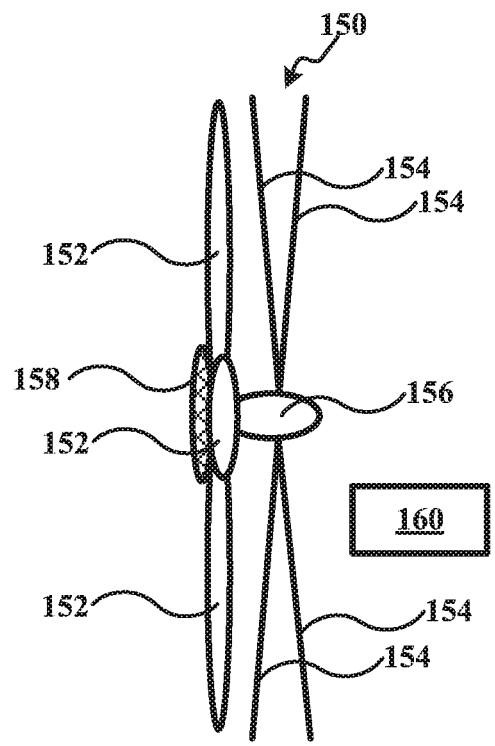
FIG. 1B illustrates cut away side view of the pieces of an impeller with a monitoring unit, according to various embodiments.

In FIG. 1B a cut away view of a single impeller 150 is illustrated. The single impeller 150 can include but is not limited to, a fan blade 152, a motor 156, a support 154 which can connect the motor 156 to the fan chassis, and a blade support 158 configured to connect the motor 156 to the at least one fan blade 152. In Some embodiments can include a monitoring unit 160 that can be separate from the single impeller 150 but within the chassis. In some embodiments the monitoring 160 unit can be outside the fan chassis monitoring the airflow. The monitoring unit 160 can be configured to identify failure or malfunction of the impeller 150. In other embodiments the monitoring unit 160 can be an internal monitoring unit 160 which connects electrically to the motor 156 and can determine whether the motor 156 has failed. An example of the separate monitoring unit 160 can include a wind speed monitor for comparing the air speed exhausting each single impeller 150 and comparing them other single impellers 150 of a fan system to determine a failure or malfunction. For example, a units for measuring of the airflow can be procured by measuring the airflow in cubic centimeters per second ($cm^3/s$). An example of the internal monitoring unit 160 can include a monitor that measures the rotational speed of in revolutions per minute (RPM) of each of the single impellers 150 and determines whether one of the impellers has a lower rotational speed than any adjacent impellers of the fan system.

Figure 2A:
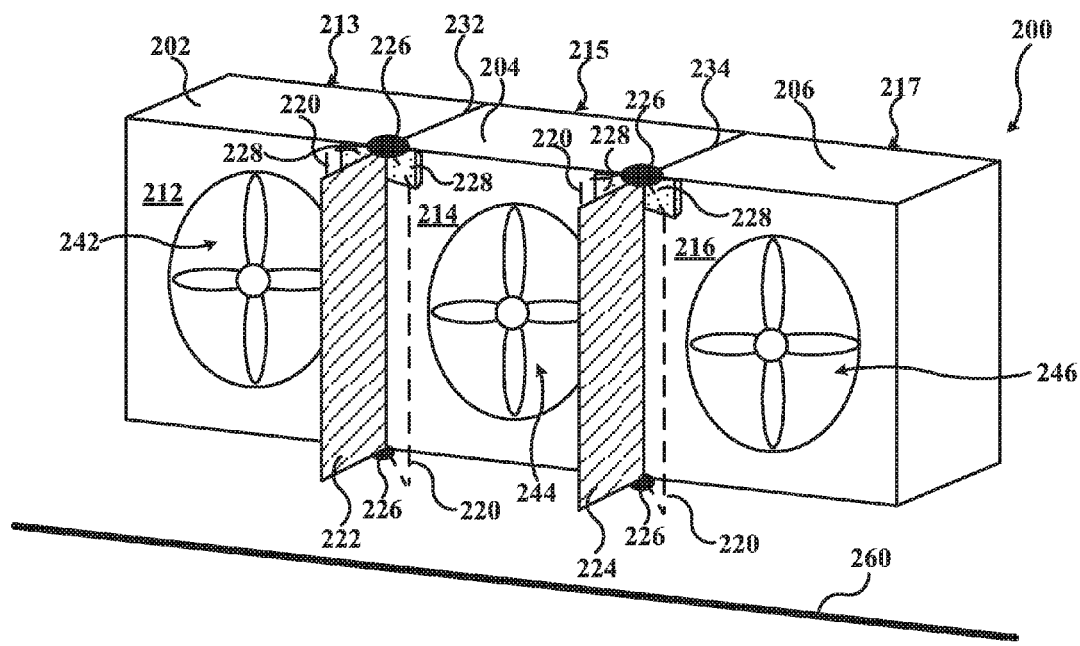
FIG. 2A illustrates a three dimensional side view of three separate multiple impeller fan chassis orientated horizontally that are aligned and attached, with vanes positioned perpendicular to the first face of the fans chassis, according to various embodiments.
Figure 2B:
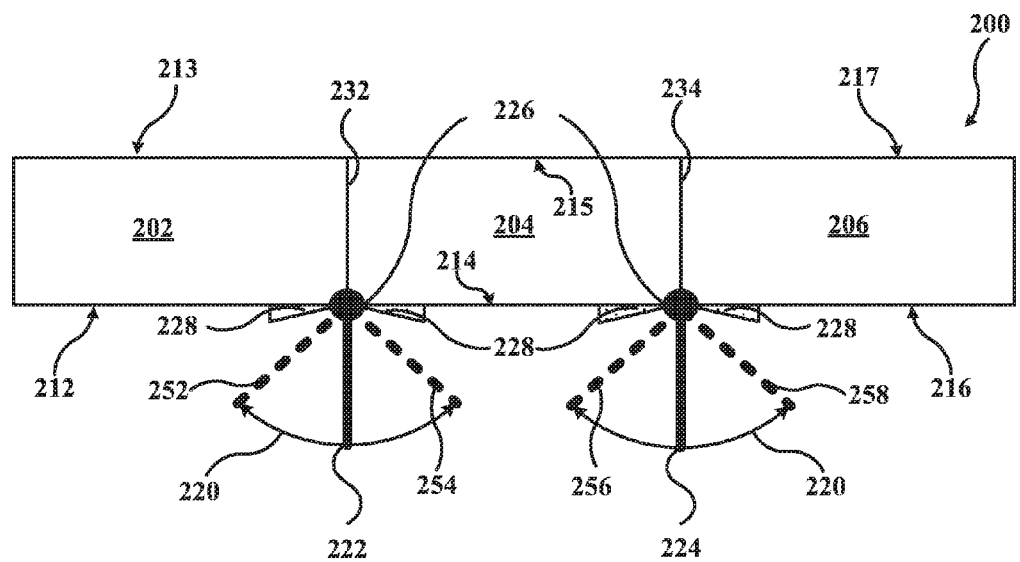
FIG. 2B illustrates a top down view of three separate multiple impeller fan chassis that are aligned and attached, with vanes positioned perpendicular to the first face of the fans chassis, according to various embodiments.

FIG. 2A and FIG. 2B depict a three dimensional view and a top down view of a three fan cooling system including three separate fan chassis each with their own multiple impeller system a three fan structure, with vanes positioned between each of the fan chassis. Each of the fan chassis with the multiple impellers are described herein, so the fan chassis with the multiple impellers will be referred to as a fan chassis throughout. The three dimensional view of FIG. 2A is orientated horizontally when compared to the bottom sidewall 260 of the frame of a center electronic complex (CEC) computer frame.

The fan system 200 can be oriented such that when the fan structure is attached to the frame of a computing system, the vanes will be oriented parallel or perpendicular when compared to the bottom sidewall of the computing system. For example, the vanes will be positioned perpendicular to the bottom sidewall 260 of the computer system if the three fan chassis are placed such that the fan system 200 is horizontal when compared to the bottom sidewall 260 of the computing system. In another example shown herein, the vanes can be positioned parallel to the bottom sidewall of the frame of the computing system if the three fan chassis are placed such that the fan system is vertical when compared to the bottom sidewall of the frame of the computing system.

FIG. 2A depicts an embodiment of a fan structure, with three attached fan chassis. Systems can include at least one fan chassis in order to cool computing systems. In this embodiment, three separate fan chassis are shown: a first fan chassis 202, a second fan chassis 204, and a third fan chassis 206, each including a multiple impeller system. The fan chassis can be attached to each other by attaching a sidewall of one of the fan chassis to another sidewall of the adjoining fan chassis where each sidewall will be substantially parallel to the other. The first fan chassis 202 includes a first face 212 and a second face 213, opposite the first face 212, with an opening 242 including a first multiple impeller system. The second fan chassis 204 includes a first face 214 and a second face 215, opposite the first face 214, with an opening 244 including a second multiple impeller system. The third fan chassis 206 includes a first face 216 and a second face 217, opposite the first face 216, with an opening 246 including a third multiple impeller system. The first face of the first fan chassis 212, the first face of the second fan chassis 214, and the first face of the third fan chassis 216 are orientated such that they are facing in a same direction.

The first fan chassis 202 is aligned to be substantially parallel to the second fan chassis 204, and can be attached at an attachment point 232. The second fan chassis 204 is aligned to be substantially parallel to the third fan chassis 206 and can be attached at attachment point 234. For example, the attachment points 232 and 234 can be accomplished by physically attaching the surfaces of the sidewalls of the chassis to each other. Examples of physical attachments can include but are not limited to, an interlocking system, a mechanical attachment, or an adhesive to hold adjoining chassis together. In some embodiments, the attachment points 232 and 234 can a part of a frame to which the sidewalls of each the fan chassis attach, orienting the sidewalls parallel to each other. In some embodiments, a frame attachment can include the attachment of a sidewall of the fan chassis to an adjacent server blade.

Vanes are positioned between the fan chassis approximately equidistant from the attached sidewalls of the fan chassis. A first vane 222 is positioned approximately equidistant between the attached sidewalls of first fan chassis 202 and the second fan chassis 204, perpendicular to the first faces of the first fan chassis 212 and the second chassis 214, and the first vane 222 being attached to the first fan chassis 202 using the angular control element 226. The first vane 222 has a first edge and a second edge, where the first edge is opposite of the second edge, and the first edge is attached to the angular control element 226. An example of approximate equidistance can include a few millimeter variance off center between the attached sidewalls. A second vane 224 is positioned approximately equidistant between the attached sidewalls of the second fan chassis 204 and the third fan chassis 206, perpendicular to the first faces of the second fan chassis 214 and the third chassis 216, and the second vane 224 is attached to the second fan chassis 204 using the angular control element 226. The second vane 224 has a first edge and a second edge, where the first edge is opposite of the second edge, and the first edge is attached to the angular control element 226. When the vanes are oriented perpendicular to the faces of the fan chassis, in an open position the vanes can divide the airflow approaching the fans evenly among the various fan chassis in the fan system 200.

In various embodiments the first vane 222 and second vane 224 may be perpendicular to the first face of the first faces of the first 212, the second 214, and the third 216 fan chassis, but not perpendicular to a bottom sidewall 260 of a frame. In an example, the first edge of the first vane 222 may be positioned such that the top of the first edge, which is furthest from the bottom sidewall 260 of the frame, starts only on the first fan chassis 202, and the bottom of the first edge of the first vane 222 ends only on the second fan chassis 204. The first vane 222 starting on the first fan chassis 202 and ending on the second fan chassis 204, can result in the vane being non-equidistant between the first fan chassis 202 and the second fan chassis 204. When comparing the first vane 222 to the bottom sidewall 260 of the frame the vane will be at an angle and not perpendicular to the bottom sidewall 260 of the frame.

According to embodiments, the vanes can be formed from metal, plastic, or another rigid material. In some embodiments the vanes can expand distally where a second edge of the vane has increased its distance away from the fans to increase the length of the vane (e.g. FIGS. 3A and 3B).

In FIG. 2B three separate fan chassis are shown, in a top down view of FIG. 2A, a first being a first fan chassis 202 with a first face 212 and a second face 213, a second being a second fan chassis 204 with a first face 214 and a second face 215, and a third being a third fan chassis 206 with a first face 216 and a second face 217, each fan system includes a multiple impeller system. The top down view better portrays the perpendicular orientation of the first vane 222 and second vane 224 facing the front face of the fan chassis of the first fan chassis 212, the second fan chassis 214, and the third fan chassis 216.

In FIGS. 2A and 2B, the first vane 222 and second vane 224 have two end orientations. The first end orientation being an open orientation where the vane is perpendicular to the first faces of the fan chassis. The second end orientation is a closed orientation, where the vane is radially adjusted as far as the angular control element 226 or an optional stopper 228 will allow the vane to superimpose the intake of the fan chassis. Adjusting the vane towards the closed position of the radial adjustment range 220 allows a decreased amount of airflow into the working fan chassis whereas the open position allows an equal distribution of airflow to each of the fan chassis adjacent to the vane. There can be numerous radial adjustment range 220 orientations for the vane between the open orientation and the closed orientation, of which the vane can be radially adjusted to, responding to an impeller failure, and the fan system (e.g. of FIG. 4B).

Figure 4A:
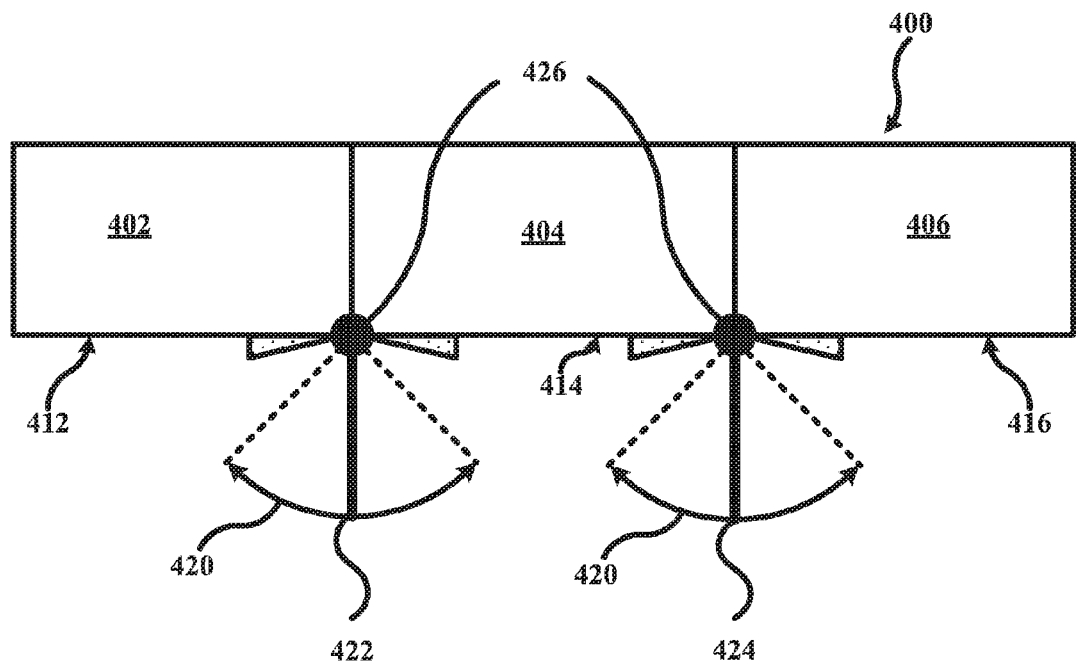
FIG. 4A illustrates a top down view of three separate multiple impeller fan chassis that are aligned and attached in a single plane, with vanes positioned perpendicular to the first face of the fans chassis, according to various embodiments.
Figure 4B:
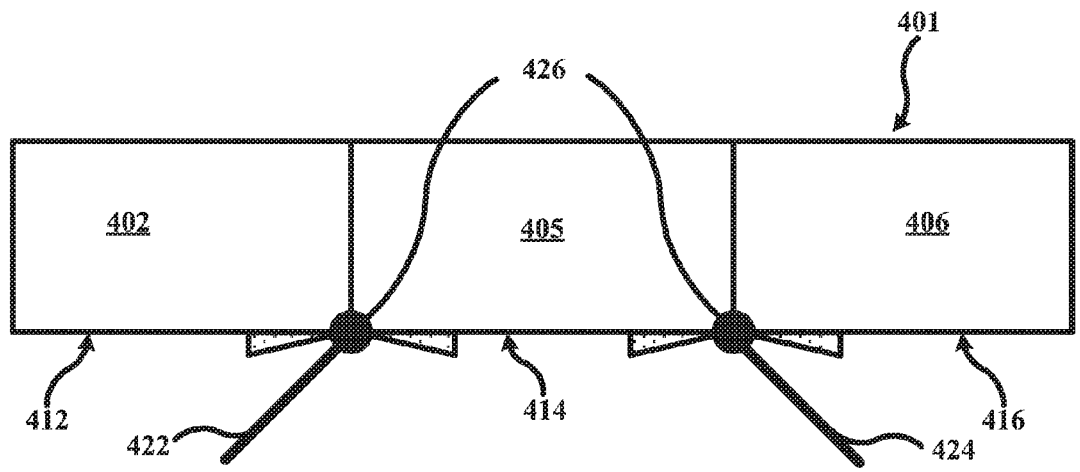
FIG. 4B illustrates a top down view of the vanes in positions not perpendicular to the face of the fan chassis, responsive to a failed fan, according to various embodiments.

The first vane 222 and the second vane 224 can be adjusted radially for example, using the angular control elements 226 to change the degree of opening, between the open orientation and the closed orientation, for each of the first faces of the chassis of the fans depending on impeller failure or airflow within the system (e.g. FIG. 4B). Example radial adjustments 220 are shown with the dotted radial adjustments of the first vane 222 and the second vane 224. The first vane 222 and second vane 224 can be adjusted to the example dotted radial adjustments. The first vane 222 can be adjusted toward the first face of the first fan chassis 212 with dotted radial adjustment 252. The first vane 222 and the second vane 224 can be adjusted toward the first face of the second fan chassis 214 with dotted radial adjustment 254 for the first vane 222 and radial adjustment 256 for the second vane 224. The second vane 224 can be adjusted toward the first face of the third chassis 216 with dotted radial adjustment 258.

One example of an angular control element 226 can be angular control springs attached to the first edge of the vane. The angular control element 226 maintains the vane perpendicular to the first faces of the fan chassis, in the open orientation, dividing the incoming airflow evenly. Should a lower conical air pressure form in front of the first face of one of the first chassis 212, the first face of the second chassis 214, or the first face of the third chassis 216, the airflow intake of one of the fan chassis can be greater than then an adjacent fan. A lower conical air pressure can be generated by an impeller failure causing a change in airflow. This greater airflow intake by one of the fan chassis can pull the vane adjoining the lower-intake chassis toward the face of the higher-intake chassis (i.e., toward the closed orientation). This vane orientation adjustment can limit the airflow received by the fan chassis with greater airflow capacity, balancing the airflow between adjoining fan chassis.

The superimposition of the fan intaking more air, allows more airflow to enter the failed fan to reach an equilibrium exhaust inside a computing device. An example of vane superimposition occurs when an impeller of a second multiple impeller fan chassis fails, and intakes less airflow compared to the first non-failed fan, the vane will then respond to the change in airflow and orientate towards a closed position superimposing the first non-failed fan chassis, the second failed fan will be intaking a second airflow. The second airflow is greater in volume compared to a first airflow before the impeller failure. The second airflow of the failed fan chassis must be non-zero.

Another example of an angular control element 226 can be a freely rotating attachment, having the vanes weighted to prevent rotation. For example if the first vane 222 and the second vane 224 can be weighted to inhibit movement and the angular control element 226 is a freely rotating attachment, and the inhibition of the rotation of the vanes can be dependent on the vanes and not the angular control element 226. If a region of low air pressure forms in front of one of the first faces of the first chassis 212, the second chassis 214, or the third chassis 216, the intake of one of the fan chassis can be greater than then an adjacent fan. The result of the intake of a first fan chassis being greater than an adjacent second fan chassis, pulls the weighted vane toward the closed orientation superimposing the first fan that is intaking more air, limiting the air received by the first fan chassis that was intaking more air. The superimposition of the first fan chassis, allows more airflow to enter the failed fan to reach an equilibrium exhaust inside a computing device.

An additional example of an angular control element 226 described further herein, can be a motor configured to adjust the orientation of the vane radially depending on data received from the fans adjacent to the vane. For example if the angular control element 226 is a motor, the angular control element 226 can receive data from a monitoring unit or the fan motor of the fan chassis adjacent to the vane. If a failure or malfunction of an impeller occurs within a multiple impeller fan chassis, data is gathered on the airflow after the impeller failure. The data of the fan chassis with the impeller failure is compared to the data of the chassis without a failed impeller. The angular control element 226 can then adjust the vane radially to a new orientation between the open and the closed orientation, based on the compared data between the fans adjacent to the vane. In some embodiments, the data can include, for example, air speed from an external monitor placed after the final impeller in the multiple impeller fan chassis, or the rotational speed of the impellers.

The first vane 222 and the second vane 224 can be adjusted radially, shown as a radial adjustment range 220. The radial adjustment range 220 can be adjusted depending on the type of fan system, and the angular control element 226. In some embodiments, optional stoppers 228 can be added to prevent the first vane 222 or the second vane 224 from covering the first fan opening 242, the second fan opening 244, or the third fan opening 246. The stoppers 228 for example, can be made out of a solid material if the angular control element 226 is a spring, a motor, or if the vanes are weighted. The stoppers 228 can also be sensors if the angular control element 226 is a motor.

A radial adjustment range 220 is shown on either side of the first vane 222 and the second vane 224. The radial adjustment range 220 displays an example range of vane adjustment that can be done using the angular control elements 226. Optional stoppers 228 can be added to prevent the first vane 222 or the second vane 224 from covering the first fan opening 242, the second fan opening 244, or the third fan opening 246. The stoppers 228 for example, can be made out of a rigid material if the angular control element 226 is the spring, the motor, or if the vanes are weighted. The stoppers 228 can also be sensors if the angular control element 226 is a motor.

Figure 3A:
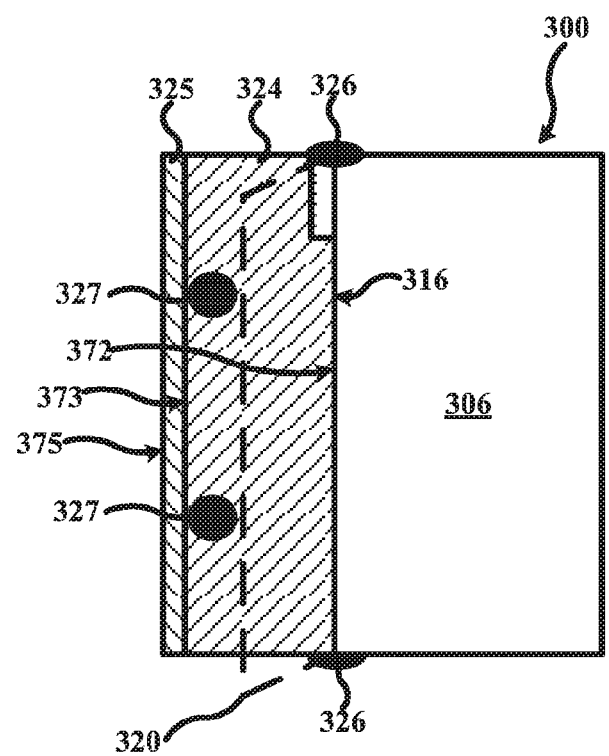
FIG. 3A illustrates a side view of a multiple impeller fan chassis and a vane that is configured to expand distally away from the multiple impeller fans with a second slidably attached vane, according to various embodiments.
Figure 3B:
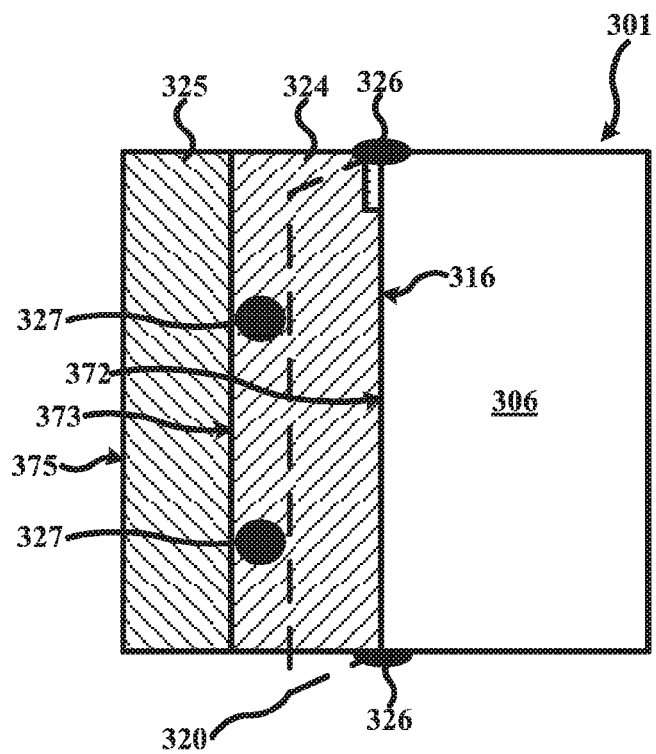
FIG. 3B illustrates a side view of a multiple impeller fan chassis and a vane with a second slidably attached vane that has expanded distally away from a first face of the multiple impeller fan chassis, according to various embodiments.

In FIG. 3A and FIG. 3B a side view of an embodiment of a vane expanding distally 300 is illustrated and is the same or substantially similar to FIG. 2A. In FIG. 3A an embodiment of a vane 324 attached to a first face of a second fan chassis with angular control element 326. The vane 324 has a first edge 372 and a second edge 373. The first edge 372 of the vane 324 is oriented such that the first edge 372 of the vane is perpendicular to the first face of the third fan chassis 316, and is positioned approximately equidistant between the attached sidewalls of the second fan chassis and the third fan chassis 306. An example of approximate equidistance can include but is not limited to a few millimeter variance off center between the attached sidewalls.

The vane 324 can be equipped with a second slidably attached vane 325 that is attached using the extension element 327 to a second end 373 of the vane 324. The slidably attached vane 325 has a first edge and a second edge 375. The extension element 327 can be used to extend the vane 324 distally away from a first faces of the second and third fan chassis 316 by increasing a length the vane 324 with the second slidably attached vane 325 with a second edge 375. In embodiments the second slidably attached vane 325 is added to further direct airflow into a fan with a failed impeller by redirecting the airflow from the adjacent non-failed multiple impeller fans to the fan with the failed impeller. The vane 324 can then be adjusted radially using the dotted radial adjustment 320 of the second vane 324 to distribute airflow by superimposing a portion of a non-failed fan chassis to distribute more airflow to a fan chassis with one or more failed impellers.

In FIG. 3B, an embodiment of post distal expansion of a second slidably attached vane 301 is illustrated. The extension element causes the vane 324 to increase in length from the first edge 372 which is attached to the angular control elements 326 which can be attached to the second fan chassis perpendicular to the first faces of the second and third fan chassis 316 to become a second length. When acquired data requires that more airflow should be directed toward a failed fan the extension elements 327 will increase the length between the first edge 372 of the first vane 324 and the new second edge 375 of the second distally expanding vane 325 that is directing the incoming airflow of the attached vane 324. The vane 324 can then be adjusted radially using the radial adjustment range 320 to distribute airflow to fan chassis with one or more failed impellers. In an example, the length of the extension element can be less than the diameter of the opening of the first face of the fan chassis such that the vane does not cover the opening of the first face of the fan chassis. For example, if the diameter of the opening of the first face of the fan chassis is 100 mm the vane may be less than 100 mm.

In another example of distal expansion of FIG. 3A the extension elements 327 can be heating elements and the vane 324 could be constructed of thermally expanding material. When the vane 324, constructed of thermally expandable material, and is heated by the extension elements 327 the second edge 373 of the vane 324 can extend to a second length distally away from the first faces of the second and third fan chassis 316. The distal expansion of the vane 324 when constructed out of thermally expandable material can cause the vane 324 to increase in length to a second vane length 325 where the second edge 373 of the vane can increase to a second edge length 375. The increase in length can cause the same or substantially similar airflow alterations as the slidably attached embodiment. The vane 324 can then be adjusted radially using to distribute airflow by superimposing a portion of a non-failed fan chassis to distribute more airflow to a fan chassis with one or more failed impellers.

In FIG. 4A and FIG. 4B, an embodiment of vane adjustment is illustrated based on a failure of an impeller of a multiple impeller fan system. In FIG. 4A, three separate fan chassis 400 are shown, in a top down view that is the same or substantially similar to the system of FIG. 2B. A first fan chassis 402 with a first face 412 and a second face 413 opposite the first face 412, a second fan chassis 404 with a first face 414 and a second face 415 opposite the first face 414, and a third fan chassis 406 with a first face 416 and a second face 417 opposite the first face 416, each including a multiple impeller system.

A first vane 422 and a second vane 424 can be oriented perpendicularly relative to the first face of the first fan chassis 412, the first face of the second fan chassis 414, and the first face of the third fan chassis 416. A radial adjustment range 420 is shown on either side of the first vane 422 and the second vane 424 responding to a change in airflow. The radial adjustment range 420 displays an example of vane adjustment between the open orientation and the closed position which can be done using the angular control elements 426.

In FIG. 4B, an embodiment of the vane adjustment 401 is done by the angular control elements 426 based on an impeller failure of the second fan chassis 405. In various embodiments, an impeller of the second fan chassis 405 fails causing more airflow to be pulled into adjacent first fan chassis 402 and third fan chassis 406. The second fan chassis 405 with the impeller failure is substantially similar to the middle fan chassis 404 in FIG. 4A (although one or more of the impellers of the multiple impeller fan system have failed or malfunctioned). Examples of impeller failure can include the impeller being damaged, or just wearing out. Examples of the impeller being worn out can include, bearing failure, blade fatigue, motor coil burnout, and electrical failure. An impeller failure can create a conical area of lower pressure in front of the first faces of the chassis which pulls airflow away from the entrance of the second fan chassis 405 with the failed fan, into the first fan chassis 402 and third fan chassis 406. To fix the issue of the conical area of low pressure, an orientation of the first vane 422 and the second vane 424 can be rotationally adjusted to restrict airflow into fan chassis 402 and 406 and to allow more airflow into the chassis 405 with the failed fan.

In embodiments the rotational adjustment of the first vane 422 and the second vane 424 using the angular control element 426 is can be done for by example, using a spring where the spring holds the vanes statically and perpendicular to the first faces of the first chassis 412, the second chassis 414, and the third chassis 416, until the impeller failure in the second chassis 405. After the failure of the impeller in the second chassis 405, the impellers of the adjacent first fan chassis 402 and the third fan chassis 406, can pull airflow away from the failed second chassis 405. The failed second chassis 405 intakes less airflow than the adjacent first 402 and third fan chassis 406, which can cause the lower conical airflow pressure in the front of the fan system. Instead the vanes can be pulled closer while being resisted with the angular control element 426 by the springs so the vanes do not immediately rotate and cover the working fans.

In embodiments the rotational adjustment of the first vane 422 and the second vane 424 using the angular control element 426 is can be done for by example, using weighted vanes. The weighted vanes can be statically held by gravity and perpendicular to the first faces of the first chassis 412, the second chassis 414, and the third chassis 416, until the impeller failure in the second chassis 405. The angular control element 426 will freely rotate and the adjustment of the vanes can be resisted by the force of gravity on the weighted vanes. After the failure of the impeller in the second chassis 405 the impellers of the adjacent first fan chassis 402 and the third fan chassis 406, can pull airflow away from the failed second chassis 405. The failed second chassis 405 intakes less airflow than the adjacent first 402 and third fan chassis 406, which can cause the lower conical air pressure in the front of the fan system. Instead the vanes will be pulled closer while being resisted by the weight of the vanes so they do not immediately rotate and cover the working fans.

In embodiments where the angular control element 426 is a motor, the angular control element can react to the impeller failure of the second chassis 405 by comparing data from the failed second chassis 405 airflow or RPM to the data from the adjacent non failed first chassis 402 and third chassis 406, and adjusting the first vane 422 and second vane 424 accordingly.

According to various embodiments, the failed impeller in the second chassis 405 causes the first vane 422 and the second vane 424 to radially adjust their orientation away from the failed second chassis 405. The first vane 422 superimposes the first fan chassis 404, and the second vane 424 superimposes the third fan chassis 406. The adjustment of the vanes can be based on the data from a monitoring unit, or from a change in the airflow. For example if a single impeller fails in the failed second chassis 405 the first vane 422 and the second vane 424 would not radially adjust as significantly as the first vane 422 and the second vane 424 would if two impellers malfunctioned or failed in the failed second chassis 405.

Figure 5A:
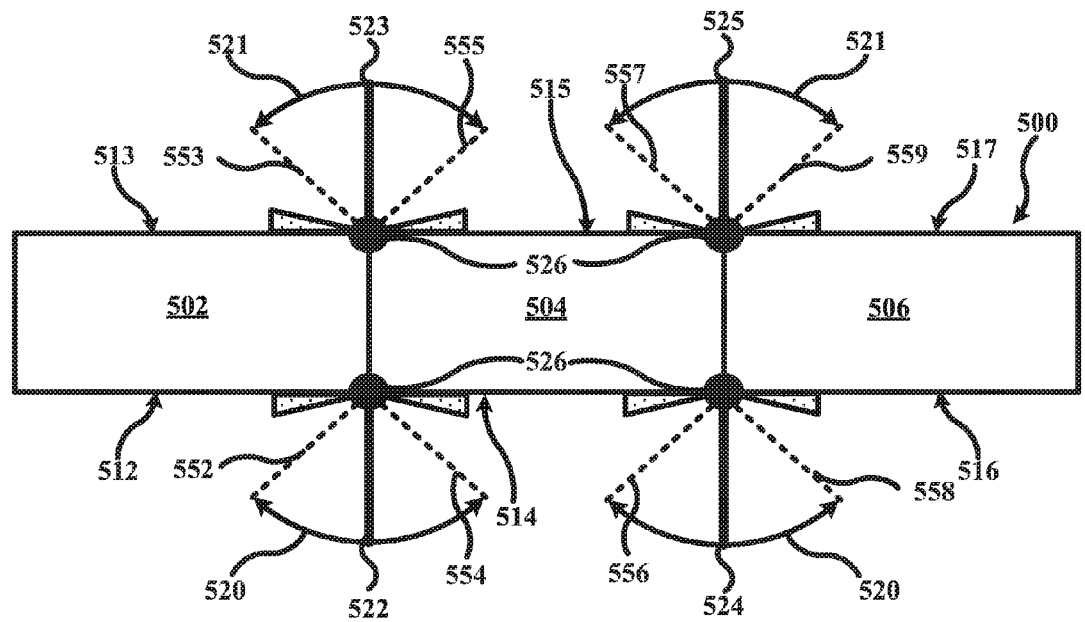
FIG. 5A illustrates a top down view of three separate multiple impeller fan chassis that are aligned and attached in a single plane with vanes positioned perpendicularly to the first face of the fan chassis on both a first face and a second face, according to various embodiments.
Figure 5B:
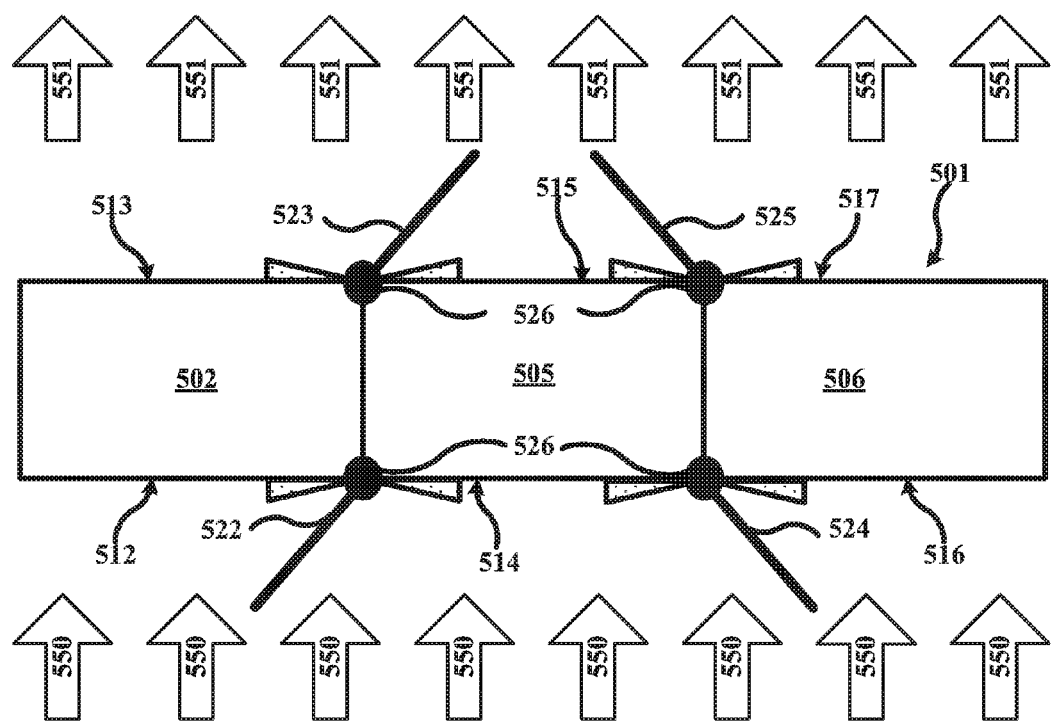
FIG. 5B illustrates a top down view of the vanes on both a first face and a second face being in positions not perpendicular to the face of the fan chassis, responsive to a failed fan, according to various embodiments.

In FIGS. 5A and 5B, another embodiment is illustrated where a second plurality of vanes are added to the embodiment of FIG. 4A where a second plurality of vanes are attached to a second face of a first and second fan chassis. In FIG. 5B a failure of an impeller in the second fan chassis when the embodiment of FIG. 5A where a second plurality of vanes were added to control the exhausts of the fans.

In FIG. 5A the first face of the first chassis 512, the second chassis 514, and the third chassis 516 are the same or substantially similar to the embodiment of FIG. 4A. A first vane 522 attached perpendicularly between the first fan chassis 502 and the second fan chassis 504 and is attached to the first fan chassis 502 with an angular control element 526, and a second vane 524 attached perpendicularly between the second fan chassis 504 and the third fan chassis 506 and is attached to the second fan chassis 504 with an angular control element 526. Each of the vanes can be oriented in perpendicularly in the open orientation in response to an even airflow the first faces of the first fan chassis 512, the second fan chassis 514, and the third fan chassis 516.

The first vane 522 is positioned approximately equidistant between the first fan chassis 502 and the second fan chassis 504, and the vane 522 is attached perpendicularly to the first fan chassis 502 using an angular control element 526. The first vane 522 has a first edge and a second edge where the first edge is opposite of the second edge of which the first edge is attached to the angular control element 526 which is attached to the first fan chassis 502 and the second edge is oriented upwind of the incoming airflow slicing the airflow to enter equally into the adjacent first fan chassis 502 and the second fan chassis 504.

The second vane 524 is positioned approximately equidistant between the second fan chassis 504 and the third fan chassis 506, and the vane 524 is attached perpendicularly to the second fan chassis 504 using the angular control element 526. The second vane 524 has a first edge and a second edge where the first edge is opposite of the second edge of which the first edge is attached to the angular control element 526 which is attached to the second fan chassis 504 and the second end is oriented upwind the incoming airflow slicing the airflow to enter equally into the adjacent second fan chassis 504 and the third fan chassis 506.

The first vane 522 and the second vane 524 can be able to be adjusted rotationally between the open and closed orientations of the radial adjustment range 520, based on the amount of airflow entering the first faces of the first chassis 512, the second chassis 514, and the third chassis 516.

Example radial adjustments 520 are shown with the dotted radial adjustments of the first vane 522 and the second vane 524 responding to a change in airflow. The first vane 522 and second vane 524 can be adjusted to the example dotted radial adjustments. The first vane 522 can be adjusted toward the first face of the first fan chassis 512 with dotted radial adjustment 552. The first vane 522 and the second vane 524 can be adjusted toward the first face of the second fan chassis 514 with dotted radial adjustment 554 for the first vane 522 and radial adjustment 556 for the second vane 524. The second vane 524 can be adjusted toward the first face of the third chassis 516 with dotted radial adjustment 558.

In FIG. 5A a second plurality of vanes can be positioned in front of the respective second faces of a first chassis 513, a second chassis 515, and a third chassis 517. A third vane 523 is attached on the second face which exhausts airflow, the third vane 523 is positioned approximately equidistant between the first chassis 502 and the second chassis 504. The third vane 523 is perpendicularly oriented relative to the second faces of the first chassis 513 and the second chassis 515, and is attached to the first fan chassis 502 with angular control elements 526. A forth vane 525 is attached on the second face which exhausts airflow, the forth vane 525 is positioned approximately equidistant between the second chassis 504 and the third chassis 506. The forth vane 525 is perpendicularly oriented relative to the second faces of the second chassis 515 and the third chassis 517, and is attached to the second fan chassis 504 angular control elements 526.

The third vane 523 is positioned approximately equidistant between the first fan chassis 502 and the second fan chassis 504. The third vane 523 is attached to the first fan chassis 502, such that the third vane 523 is perpendicular to the second faces of the first fan chassis 513 and second fan chassis 515, using an angular control element 526. The third vane 523 has a first edge and a second edge, where the first edge is opposite of the second edge. The first edge is attached to the angular control element 526 which is attached to the first fan chassis 502 and the second edge is oriented downwind of the incoming airflow that is entering the computer system.

The fourth vane 525 is positioned approximately equidistant between the second face of the second fan chassis 515 and the third fan chassis 517. The forth vane 525 is attached to the second fan chassis 504, such that the fourth vane 525 is perpendicular to the second faces of the first second chassis 515 and third fan chassis 517, using an angular control element 526. The forth vane 525 has a first edge and a second edge, where the first edge is opposite of the second edge. The first edge is attached to the angular control element 526 which is attached to the second fan chassis 504. The second edge is oriented downwind of the incoming airflow that is entering the computer system.

The third vane 523 and the fourth vane 525 are able to be adjusted rotationally between the open and closed orientations of the radial adjustment range 521, based on the amount of airflow exhausting the second faces of the first chassis 513, the second chassis 515, and the third chassis 517.

Example radial adjustments 521 are shown with the dotted radial adjustments of the third vane 522 and the fourth vane 524. The third vane 522 and fourth vane 524 can be adjusted to the example dotted radial adjustments. The third vane 522 can be adjusted toward the first face of the first fan chassis 512 with dotted radial adjustment 553. The third vane 522 and the fourth vane 524 can be adjusted toward the first face of the second fan chassis 514 with dotted radial adjustment 555 for the third vane 522 and radial adjustment 557 for the fourth vane 524. The fourth vane 524 can be adjusted toward the first face of the third chassis 516 with dotted radial adjustment 559.

FIG. 5B depicts an embodiment of a fan chassis assembly 501 where the vane adjustment is done by the angular control elements 526 based on an impeller failure of the second fan chassis 505. In the embodiment an impeller of the second fan chassis 505 fails causing more airflow to be pulled into adjacent first fan chassis 502 and third fan chassis 506. The second fan chassis 505 with the impeller failure, is substantially similar to the middle fan chassis 504 in FIG. 5A although one or more of the impellers of the multiple impeller fan system have failed or malfunctioned.

Examples of the impeller being worn out and failing can include, but are not limited to, bearing failure, blade fatigue, motor coil burnout, and electrical failure. An impeller failure can create a conical area of lower pressure in front of the first faces of the fan chassis. The conical area of low pressure pulls airflow away from the entrance of the second fan chassis 505 with the failed fan into the first fan chassis 502 and third fan chassis 506. To fix the issue of the conical area of low pressure an orientation of the first vane 522 and the second vane 524 are rotationally adjusted to allow more airflow into the second failed fan chassis 505. Whereas the third vane 523 and the fourth vane 524 adjust toward the second failed fan chassis 505 to even out the airflow exiting the second faces of the first fan chassis 502, the second failed fan chassis 505, and third fan chassis 506.

In some embodiments, the rotational adjustment of the first vane 522, and the second vane 524, are adjusted using the angular control element 526 is can be done for by example, using a spring where the spring holds the vanes statically and perpendicular to the first faces of the first chassis 512, the second chassis 514, and the third chassis 516, until the impeller failure in the second chassis 505. After the failure of the impeller in the second chassis 505 the impellers of the adjacent first fan chassis 502 and the third fan chassis 506, will pull airflow away from the failed second chassis 505, instead the vanes will be pulled closer while being resisted with the angular control element 526 by the springs so they do not immediately rotate and cover the working fans.

In some embodiments, the orientations of the third vane 523, and the fourth vane 525, are set using the angular control element 526 such as a spring that can hold the vanes statically and perpendicular to the second faces of the first chassis 513, the second chassis 515, and the third chassis 516, until the impeller failure in the second chassis 505. After the failure of the impeller in the second chassis 505 the impellers of the adjacent first fan chassis 502 and the third fan chassis 506, will exhaust more airflow than the failed second chassis 505, and the vanes can move toward the closed orientation, partially blocking airflow into the second fan chassis 505. The orientation of the vanes can be resisted by the spring angular control element 526 so that they do not immediately rotate and completely cover the opening of the second fan chassis 505.

In embodiments, the rotational adjustment of the first vane 522 and the second vane 524 using the angular control element 526 is can be done for by example, using weighted vanes. The weighted vanes can be statically held by gravity and perpendicular to the first faces of the first chassis 512, the second chassis 514, and the third chassis 516, until the impeller failure in the second chassis 505. The angular control element 526 will freely rotate and the adjustment of the vanes can be resisted by the force of gravity on the weighted vanes. After the failure of the impeller in the second chassis 505 the impellers of the adjacent first fan chassis 502 and the third fan chassis 506, can pull airflow away from the failed second chassis 505. The failed second chassis 505 intakes less airflow than the adjacent first 502 and third fan chassis 506, which can cause the lower conical air pressure in the front of the fan system. Instead, the vanes will be pulled closer while being resisted by the weight of the vanes so they do not immediately rotate and cover the working fans.

In embodiments, the rotational adjustment of the third vane 523 and the fourth vane 525 using the angular control element 526 is can be done for by example, using weighted vanes. The weighted vanes can be statically held by gravity and perpendicular to the second faces of the first chassis 513, the second chassis 515, and the third chassis 517, until the impeller failure in the second chassis 505. The angular control element 526 will freely rotate and the adjustment of the vanes can be resisted by the force of gravity on the weighted vanes. After the failure of the impeller in the second chassis 505 the impellers of the adjacent first fan chassis 502 and the third fan chassis 506, can exhaust more airflow compared to the failed second fan chassis 505 with the failed fan. The failed second chassis 505 exhaust less airflow than the adjacent first 502 and third fan chassis 506, which can cause uneven cooling within the system. Instead the third vane 523 and the fourth vane will be pushed closer toward the failed second fan chassis 505 while being resisted by the weight of the vanes so they do not immediately rotate and cover the failed second fan chassis 505. The vanes will allow for an even distribution of airflow entering the system.

In embodiments, where the angular control element 526 is a motor, the angular control element can react to the impeller failure of the second chassis 505 by comparing data from the failed second chassis 505 airflow or RPM to the data from the adjacent non failed first chassis 502 and third chassis 506, and adjusting the first vane 522 and second vane 524 accordingly.

In embodiments, where the angular control element 526 is a motor, the angular control element can react to the impeller failure of the second chassis 505 by comparing data from the failed second chassis 505 airflow or the rotational speed data from the adjacent non failed first chassis 502 and third chassis 506, and adjusting the third vane 523 and fourth vane 525 accordingly.

According to various embodiments, the failed impeller in the second chassis 505 causes the first vane 522 and the second vane 524 to radially adjust their position away from the failed second chassis 505. The first vane 522 superimposes the first fan chassis 504, and the second vane 524 superimposes the third fan chassis 506. The adjustment of the vanes can be based on the data from a monitoring unit, or from a physical change in the airflow. For example if a single impeller fails in the failed second chassis 505 the first vane 522 and the second vane 524 would not radially adjust as significantly as the first vane 522 and the second vane 524 would if two impellers malfunctioned or failed in the failed second chassis 505.

According to various embodiments, the failed impeller in the second chassis 505 can cause the third vane 523 and the fourth vane 525 to radially adjust their positions toward from the failed second chassis 505. The third vane 523 superimposes the second fan chassis 505 on the side attached to the first fan chassis 502, and the fourth vane 525 superimposes the second fan chassis 505 on the side attached to the third fan chassis 506. The adjustment of the vanes can be based on the data from a monitoring unit, or from a physical change in the airflow. For example if a single impeller fails in the failed second chassis 505 the third vane 523 and the fourth vane 525 would not radially adjust as significantly as the third vane 523 and the fourth vane 525 would if two impellers malfunctioned or failed in the failed second chassis 505.

According to various embodiments, airflow is illustrated to show the intake airflow 550 distribution of the vanes prior to being altered by the first vane 522 and the second vane 524, and the exhaust 551 being altered by the third vane 523 and fourth vane 525. The first vane 522 and second vane 524 distribute more of the intake airflow 550 to the second chassis 505 with the failed impeller. The third vane 523 is adjusted with the exhaust of the first fan chassis 502 and second fan chassis 505 with the failed impeller, and the fourth vane 525 is adjusted with the exhaust of the third fan chassis 506 and second fan chassis 505 with the failed impeller. The alterations of the third vane 523 and the fourth vane 525 alter the exhaust to be even when entering the computer system to allow for proper airflow distribution.

Figure 6:
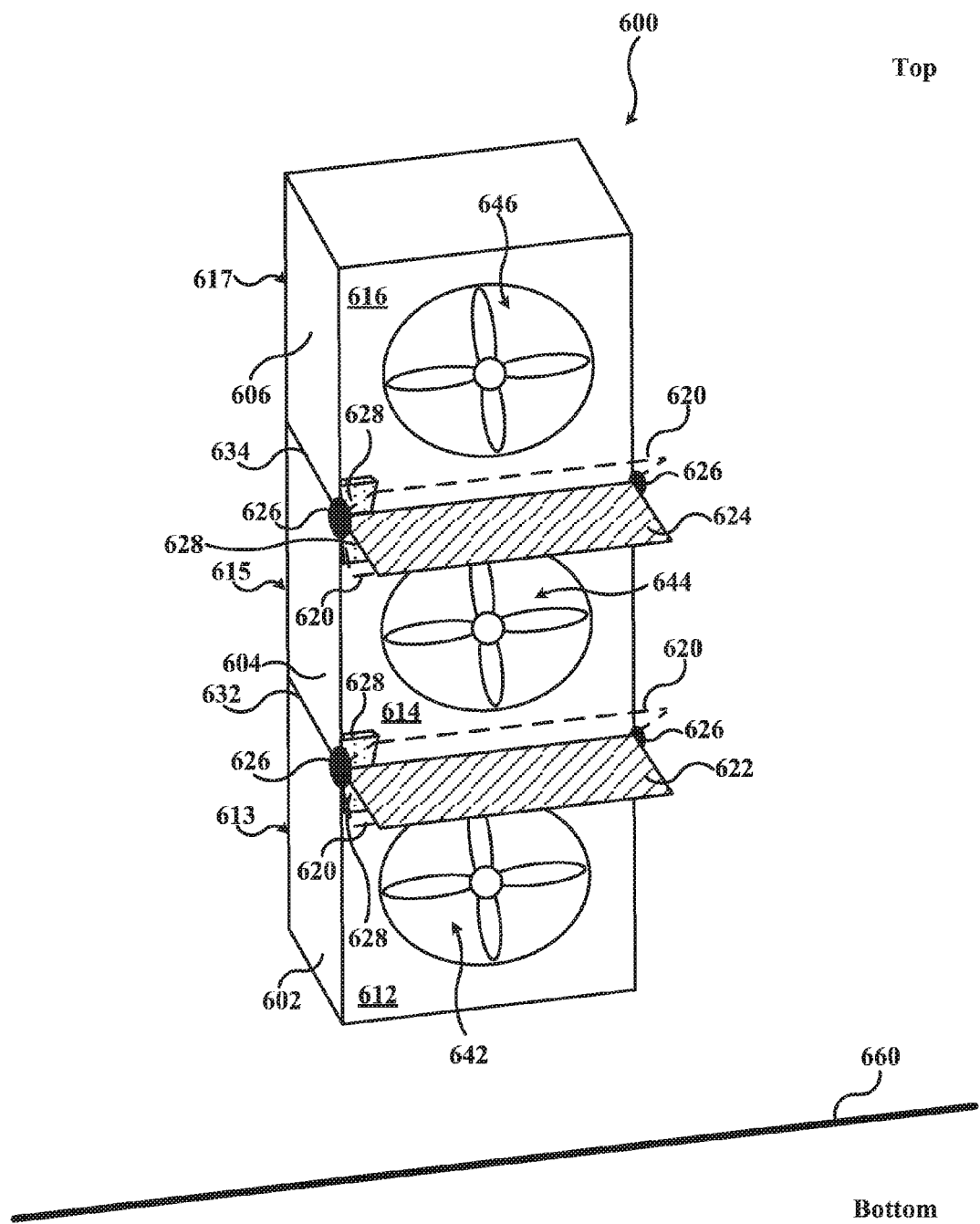
FIG. 6 illustrates a three dimensional side view of three separate multiple impeller fan chassis orientated vertically that are aligned and attached, with vanes positioned perpendicular to the first face of the fans chassis, according to various embodiments.

According to various embodiments, the fan system can be orientated vertically. An example of a fan system can include the fan system 200 found in FIG. 2A, and FIG. 6 illustrates an embodiment of the fan system 200 being orientated vertically. In this embodiment a first vane 622 and a second vane 624 can be positioned parallel when compared to the bottom sidewall 660 of the frame.

FIG. 6 depicts an embodiment of a fan chassis assembly, with three attached fan chassis fan structure. Three separate fan chassis are shown: a first fan chassis 602, a second fan chassis 604, and a third fan chassis 606, each including a multiple impeller system. The fan chassis can be attached to each other by attaching a sidewall of one of the fan chassis to another sidewall of the adjoining fan chassis where each sidewall will be substantially parallel to the other. The first fan chassis 602 including a first face 612 and a second face 613, opposite the first face 612, with an opening 642 including a first multiple impeller system. The second fan chassis 604 including a first face 614 and a second face 615, opposite the first face 614, with an opening 644 including a second multiple impeller system. The third fan chassis 606 including a first face 616 and a second face 617, opposite the first face 616, with an opening 646 including a third multiple impeller system. The first face of the first fan chassis 612, the first face of the second fan chassis 614, and the first face of the third fan chassis 616 can be orientated such that they are facing in a same direction.

The first fan chassis 602 is aligned to be substantially parallel to the second fan chassis 604, and can be attached at an attachment point 632. The second fan chassis 604 is aligned to be substantially parallel to the third fan chassis 606 and can be attached at attachment point 634. For example, the attachment points 632 and 634 can be accomplished by physically attaching the surfaces of the sidewalls of the chassis to each other.

The first vane 622 and the second vane 624 are positioned between the fan chassis approximately equidistant from the attached sidewalls of the fan chassis. A first vane 622 is positioned approximately equidistant between the attached sidewalls of first fan chassis 602 and the second fan chassis 604, perpendicular to the first faces of the first fan chassis 612 and the second chassis 614, and the first vane 622 being attached to the first fan chassis 602 using the angular control element 626. The first vane 622 has a first edge and a second edge, where the first edge is opposite of the second edge, and the first edge is attached to the angular control element 626. A second vane 624 is positioned approximately equidistant between the attached sidewalls of the second fan chassis 604 and the third fan chassis 606, perpendicular to the first faces of the second fan chassis 614 and the third chassis 616, and the second vane 624 is attached to the second fan chassis 604 using the angular control element 626. The second vane 624 has a first edge and a second edge, where the first edge is opposite of the second edge, and the first edge is attached to the angular control element 626. When the vanes are oriented perpendicular to the faces of the fan chassis, the vanes can divide the airflow approaching the fans evenly among the various fan chassis in the fan system 600.

In various embodiments, the first vane 622 and the second vane 624 are both positioned parallel to the bottom sidewall 660. In an example the bottom sidewall 660 can be orientated such that it is parallel with the ground. In the example, since the bottom sidewall 660 is parallel to the ground such that the first vane 622 and the second vane 624 are also parallel to the ground. Since the first vane 622 and the second vane 624 in the example, are parallel to the ground angular control elements 626 can also resist a force of gravity upon the first vane 622 and the second vane 624 along with changes in the airflow. In an example of the angular control elements 626 being springs, the top spring can need to resist 2 N (newton) of force while the bottom spring can need to only resist 1.9 N of force.

According to embodiments, the vanes can be formed from metal, plastic, or another rigid material. In some embodiments the vanes can expand distally where a second edge of the vane has increased its distance away from the fans to increase the length of the vane (e.g. FIGS. 3A and 3B).

In fan system 600 the first vane 622 and second vane 624 have two end orientations. The first end orientation being an open orientation where the vane is perpendicular to the first faces of the fan chassis. The second end orientation is a closed orientation, where the vane is radially adjusted as far as the angular control element 626 or an optional stopper 628 will allow the vane to superimpose the intake of the fan chassis. The closed position of the radial adjustment range 620 lets a significantly decreased amount of airflow into the working fan chassis whereas the open position allows an equal distribution of airflow to each of the fan chassis adjacent to the vane. There can be numerous radial adjustment range 620 orientations for the vane between the open orientation and the closed orientation, of which the vane can be radially adjusted to, responding to an impeller failure, and the fan system (e.g. of FIG. 4B).

In various embodiments the vanes do not need to be positioned vertically or horizontally, or perpendicular or parallel when compared to the bottom sidewall of the frame. In an example, the vanes can be positioned in any orientation but still perpendicular to the first faces of the fan chassis and positioned approximately equidistant to the attached sidewalls of each of the fan chassis. In another example the vanes can still perpendicular to the first faces of the fan chassis but not equidistant to the attached sidewalls of each of the fan chassis.

Figure 7A:
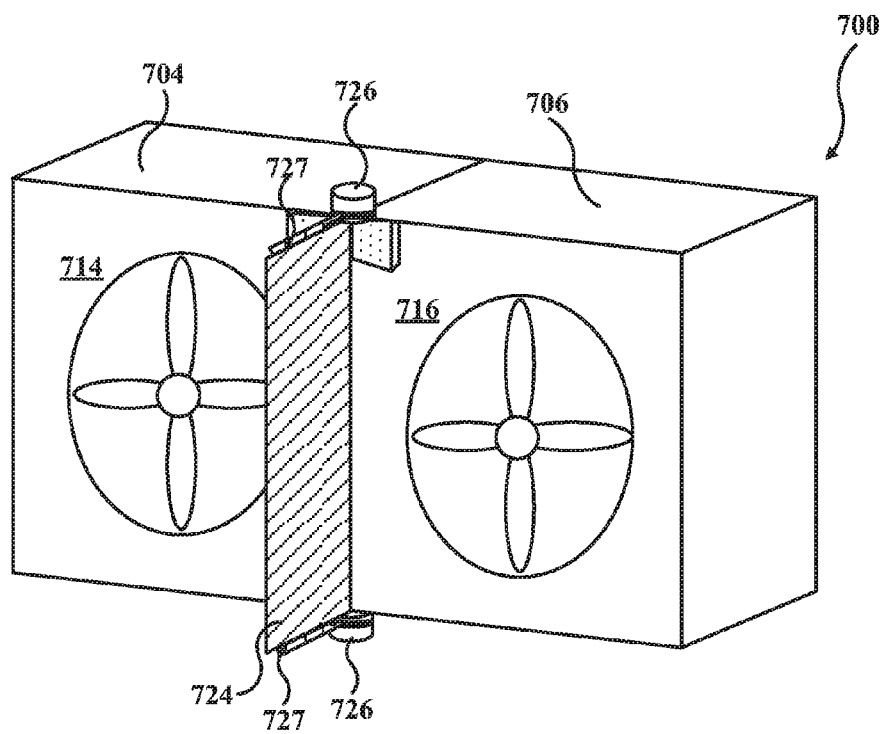
FIG. 7A illustrates a three dimensional side view of two separate multiple impeller fan chassis orientated horizontally with a motor as an angular control unit attaching a vane positioned perpendicular to the first face of the fan chassis, according to various embodiments.
Figure 7B:
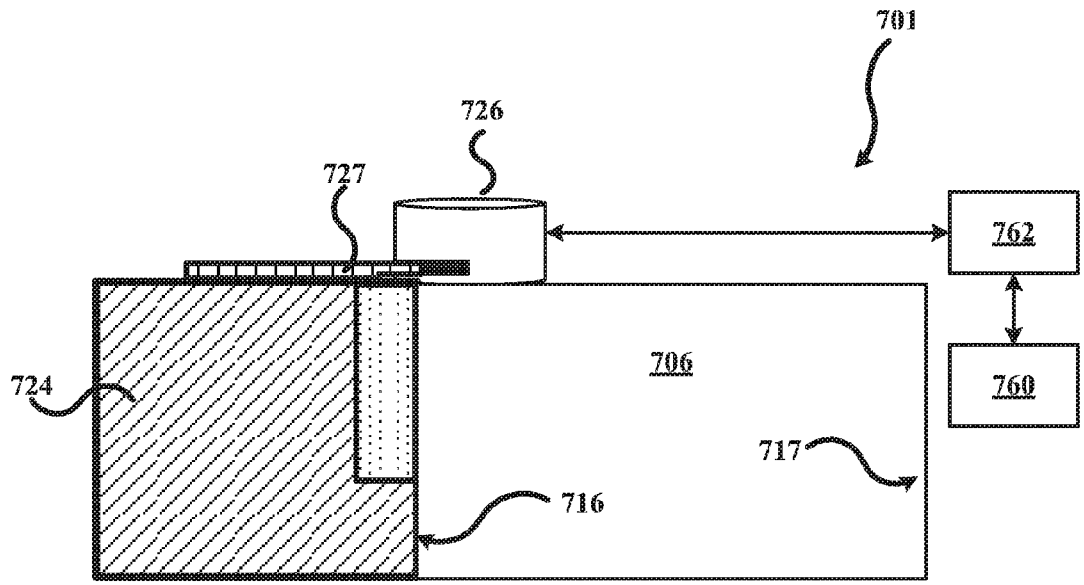
FIG. 7B illustrates a magnified side view of the motor as the angular control unit attached to the vane and coupled electrically to a monitoring unit to determine the required adjustment range, according to various embodiments.

FIGS. 7A and 7B an angular control element in the embodiment of the fan structure is a motor used for the adjustment of the vane using an adjustment support. FIG. 7A illustrates an embodiment of a three dimensional side view of two separate multiple impeller fan chassis orientated horizontally as a fan system 700 according to various embodiments. In the embodiment an angular control element is a motor 726 with an adjustment support 727 that can transfer adjustments from the motor 726 to a second vane 724. The motors 726 can be mounted to the second fan chassis 704, and hold the second vane 724 perpendicular to a first face of a second fan chassis 714 and a first face of a third fan chassis 716. The motors 726 can adjust the second vane 724 radially between an open position and a closed position. The adjustment of the vane can be done by a control unit 762 in response to a failure of an impeller of the second fan chassis 704 or a failure of an impeller of the third fan chassis 706. An example of a control unit, the control unit can be a singular unit controlling each of the vanes in the fan system, positioning each according to the data received from each fan chassis respective monitoring unit.

FIG. 7B illustrates a magnified side view of the motor 726 as an angular control element attached to the vane 724, and coupled electrically to a monitoring unit 760 with a control unit to determine an adjustment range of a vane. An angular control element which is a motor 726 is attached to the second fan chassis and holds the second vane 724 perpendicularly to the first face of the third fan chassis 716 of the fan system 701. The motor 726 is connected to the second vane 724 with an adjustment support 727. The adjustment support 727 can be used by the motor 726 to adjust the position of the vane radially between an open and a closed position in response to an impeller failure. The adjustment of the motor 726 can be based on data transferred to the control unit 762. The data can be gathered from a monitoring unit 760 based on the measurements of the airflow of the second fan chassis and the third fan chassis 706 using the monitoring unit for the second fan chassis and the monitoring unit for the third fan chassis 760.

In embodiments the data gathered from the monitoring unit 760 for example, can be based on the airflow of a measurement of the exhaust exiting a second face of the third fan chassis 717. The monitoring unit 760 can compare the airflow of the exhaust and compare the airflow of the exhaust from the second face of the third fan chassis 717 to the adjacent surrounding fans. The position of the second vane 724 can be radially adjusted to increase or decrease the amount of airflow the third fan chassis 706 can intake responding to a failure of an impeller of the third fan chassis 706 or of an adjacent fan chassis.

In another example the monitoring unit 760 can be coupled internally with a motor of an impeller, and measure the revolutions per minute (RPM) of each of the impellers. If an impeller fails the monitoring unit 760 can send data to the control unit 762 to adjust the position of the second vane 724 using the motor 726 to increase or decrease the amount of airflow entering the third fan chassis 706.

In embodiments of the adjustment of the vane can be based on calculating a difference in airflow between the second fan chassis and the third fan chassis 706. The monitoring unit 760 sends the measurements of the airflow exhausting the second face of the second fan chassis and the second face of the third fan chassis 717. The measurements are then sent to the control unit 762 which is electrically coupled to the motor 726. The adjustment of the second vane 724 can be based on the difference between the measurements of the airflow of the second fan chassis and the third fan chassis 706. For example if the measurement of the airflow of the second fan chassis is less than the measurement of the airflow of the third fan chassis 706 the second vane 724 can be radially adjusted towards the closed position superimposing the first face of the third fan chassis 716. If the measurement of the second fan chassis airflow is zero the second vane 724 can be held in the open position.

For example, if the second vane 724 is adjusted towards the closed position based on an impeller failure of the second fan chassis and a second impeller fails causing the measurement to be zero. In response to the measurement being zero, the second vane 724 can return to the open position to prevent the second vane 724 from reducing the airflow of the fan system further. In another example, in response to a failure of both impellers of a fan chassis, a manual reset switch can be pressed by a user to send a manual reset signal to the control unit 762 to return the second vane 724 to the open position.

In embodiments, the adjustment of the vane can be measured by the degree of rotation of the vane based on the adjustment of the motor receiving data from the control unit. To determine measurable vane adjustment, if the monitoring unit can calculate a difference between the measured airflow from a first fan chassis compared to the second fan chassis. In an example, if the first fan chassis was exhausting 10% more airflow compared to a second fan chassis the vane can be radially adjusted 5° towards the first face of the first fan superimposing the first fan. In another example, if the second fan chassis is exhausting 20% more airflow compared to the first fan chassis the vane can be radially adjusted 10° towards the first face of the second fan superimposing the second fan. In another example, if the first fan chassis is exhausting 100% more airflow the vane can remain in the open position to not superimpose either the first face of the first fan chassis or the first face of the second fan chassis.

In various embodiments, the monitoring unit can be detecting a measurement of temperatures of the components within a frame. Examples of components within a frame where the frame is a server can include, separate server blades, or specific components on each server blade like each microprocessor. Using separate server blades as an example, where a first fan is dedicated to cooling a first server blade, and a second fan is dedicated to cooling a second server blade. If the first server blade is operating at a higher measurement of temperature when compared to a measurement of temperature of the second server blade, a vane can be adjusted radially by the angular control element. The radial adjustment of the vane can superimpose the second fan chassis directing more airflow into the first fan chassis.

In various embodiments, the measurement of the temperature differential can be used to detect an impeller failure of a fan chassis. The temperature differential can result from a failed impeller causing the fan chassis with a failed impeller to intake a lower volume of airflow, the vane can be radially adjusted by the angular control element towards the non-failed fan chassis. The radial adjustment of the vane can increase the exhaust being outputted by the failed fan chassis causing a more even exhaust of the failed and non-failed fan chassis. Using separate server blades as an example, where a first fan is dedicated to cooling a first server blade, and a second fan is dedicated to cooling a second server blade. If the first server blade is operating at a higher measurement of temperature, due to a failed impeller, when compared to a measurement of temperature of the second server blade, a vane can be adjusted radially by the angular control element. The radial adjustment of the vane can superimpose the second fan chassis directing more airflow into the first fan chassis.

In embodiments, the vane can also be radially adjusted toward the open position based on a change in the airflow differential of the first fan chassis and the second fan chassis. If a change in airflow or a second failure causes a second airflow differential the vane can be repositioned towards the open position. In an example, if the control unit 762 determines a second failure of an impeller resulting in a third measurement of the airflow from the first fan chassis and a fourth measurement of the airflow from the second fan chassis, the monitoring unit can readjust the vane towards the open position.

An example of the readjustment toward the open position can be, if a first measurement of airflow of a first fan chassis is greater than the second measurement of airflow of the second fan chassis causing a difference in airflow. The difference in airflow can cause the vane to radially adjust toward the closed position superimposing the first fan chassis. The adjustment of the vane towards the closed position then can cause the third measurement of airflow of the first fan chassis to be less than the fourth measurement of the airflow of the second fan chassis. The vane can then be readjusted by the angular control element from the control unit 762 radially back toward the open position.

Figure 8:
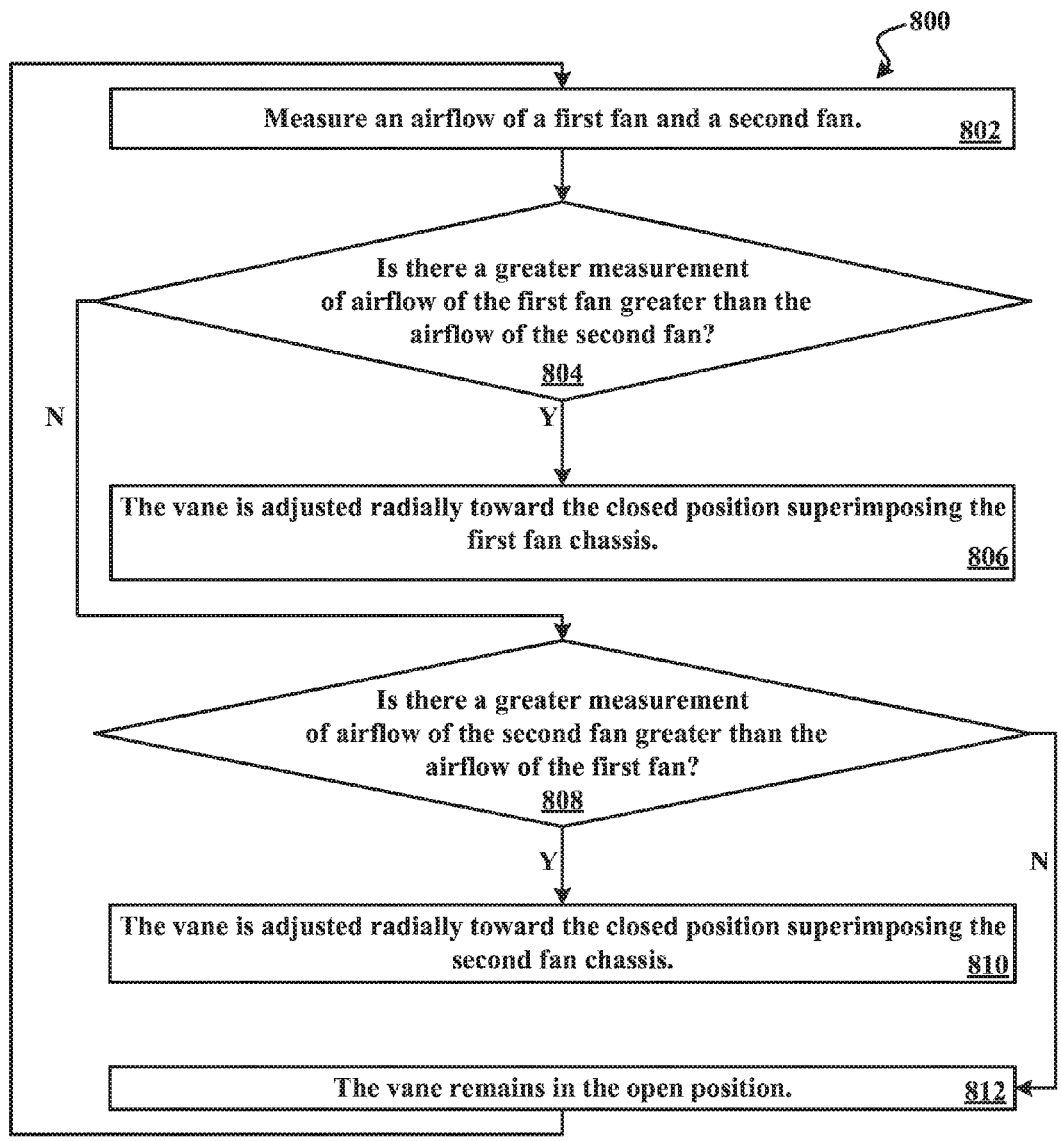
FIG. 8 illustrates a flow chart of an adjustment of a vane when the angular control element is a motor, according to various embodiments.

FIG. 8 illustrates a flow chart of the method 800, of the vane being altered based on a measurement of an airflow differential between a first fan and a second fan, according to various embodiments. In operation 802, the airflow of a first fan and a second fan are measured. The measurement can be performed for example, by a monitoring unit. The monitoring unit can communicate with a control unit to determine the radial adjustment of a vane, and the radial adjustment of the vane can be done by the angular control element which can be a motor. In operation 804, the measurements of the airflow are compared to determine if an airflow of the first fan is greater than the airflow of the second fan. In operation 806, if the measurement of the airflow of the first fan is greater that the measurement of the second fan, then the vane can be adjusted radially toward the closed position. The closed position superimposes the first face of the fan chassis. If the measurement of the airflow of the second fan is greater or equal to the measurement of the airflow of the first fan the process will continue to operation 808. In operation 808, the measurements of the airflow are compared to determine if the measurement of the airflow of the second fan is greater than the measurement of the airflow of the first fan. In operation 810 if the determination of the airflow of the second fan is greater, the vane can be adjusted radially toward the closed position superimposing the second fan. If the measurement of the airflow of the second fan is not greater than the measurement of the airflow of the first fan in operation 808, the process proceeds to operation 812. In operation 812, the measurement airflow of the first fan and the measurement of the second fan are equal. The method 800 is then repeated based on a conditional response to an impeller failure.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:
1. A cooling system comprising:
a first fan and a second fan, the first and second fans each including:
   a fan chassis, including:
      a first face with a first opening,
      a second face with a second opening,
      two or more impellers aligned in series of a multiple impeller counter-rotational central electronic complex fan,
      a chassis sidewall,
      wherein the first face and the second face oppose each other, and
      wherein the fan chassis sidewall is perpendicular to the first face and the second face;
wherein the first fan chassis and the second fan chassis are attached to a server blade;
wherein the first fan chassis and the second fan chassis are attached adjacent to each other, such that the chassis sidewall of the first fan chassis is substantially parallel to the chassis sidewall of the second fan chassis;
wherein the first face of the first fan chassis and the first face of the second fan chassis are facing a same direction and are configured to intake a first airflow through the first face of the first fan chassis and the first face of the second fan chassis and exhaust the first airflow through the second face of the first fan chassis and the second face of the second fan chassis;
one or more vanes, including:
   a first vane, positioned approximately equidistant from the attached sidewalls of the first face of the first fan chassis and the first face of the second fan chassis, the first vane having a first edge, and the first edge of the first vane is attached perpendicularly to the first face of the first fan chassis,
   a second vane, positioned approximately equidistant from the attached sidewalls of the second face of the first fan chassis and the second face of the second fan chassis, the second vane having a second edge, and the second edge of the second vane is attached perpendicularly to the second face of the first fan chassis;
one or more extension elements, including:
   a first extension element configured to produce heat to expand a length of the first vane distally away from the first face of the first fan chassis by constructing the first vane out of thermally expandable material and heating the first vane with a heating element as the first extension element, and
   a second extension element, which includes attaching a third slidably attached vane to the second vane, allowing the third slidably attached vane to extend distally away from the second face of the first fan chassis by the second extension element;
one or more angular control elements, including:
   a first angular control element that is configured to orient a position of the first vane radially relative to the first face of the first fan chassis along the first edge of the first vane, based on impeller failure altering the first airflow entering the first face of the first fan chassis and the first face of the second fan chassis by:
      superimposing the first face of the second fan chassis in response to a second non-zero airflow entering into the first face of the first fan chassis where the second non-zero airflow entering the first face of the first fan chassis is less than the first airflow entering the second fan chassis, the angular control element including:
a first motor that is configured to alter the position of the first vane by:
  determining a failure of the first fan chassis based on data from a first monitoring unit, and
  varying the angle of the first vane from an open position towards a closed position based on the data from the first monitoring unit in the first fan chassis being different than the data from a second monitoring unit in the second fan chassis; and
a second angular control element, which is configured to orient a position of the second vane radially relative to the second face of the first fan chassis along the second edge of the second vane, based on impeller failure altering the first airflow exhausting the second face of the first fan chassis and the second face of the second fan chassis by:
  superimposing the second face of the first fan chassis in response to a second non-zero airflow exhausting the second face of the first fan chassis where the second non-zero airflow exhausting the second face of the first fan chassis is less than the first airflow exhausting the second fan chassis, the angular control element including:
a first spring that is configured to alter the position of the second vane by:
  holding, in response to the second non-zero airflow exhausting the second face of the first fan chassis and the first airflow exhausting the second fan chassis being equal, the second vane statically and is perpendicular to the second face of the first fan chassis, and
  varying, in response to the second non-zero airflow exhausting the second face of the first fan chassis being less than the first airflow exhausting the second fan chassis, the angle of the first vane from the open position towards the closed position, including superimposing the second face of the first fan chassis where the first spring resists the movement of the second vane until the second non-zero airflow exhausting the first fan chassis is equal to the first airflow exhausting the second fan chassis.

\* \* \* \* \*